(12) United States Patent
Baba et al.

(10) Patent No.: US 6,729,213 B1
(45) Date of Patent: May 4, 2004

(54) MANUFACTURING METHOD OF MONOLITHIC ELECTRONIC COMPONENTS

(75) Inventors: Hiroyuki Baba, Takefu (JP); Takao Hosokawa, Fukui-Ken (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 0 days.

(21) Appl. No.: 09/527,173

(22) Filed: Mar. 17, 2000

(30) Foreign Application Priority Data

Apr. 15, 1999 (JP) .......................................... 11-107652

(51) Int. Cl.$^7$ ................................................ B26D 7/18
(52) U.S. Cl. ................................ 83/13; 83/24; 83/152; 83/88
(58) Field of Search ........................... 83/152, 88, 100, 83/451, 87, 97, 929.1, 13; 271/286; 29/74.3, DIG. 44; 294/64.1, 2

(56) References Cited

U.S. PATENT DOCUMENTS

| | | | | |
|---|---|---|---|---|
| 3,232,605 A | * | 2/1966 | Plummer ....................... 83/88 |
| 5,019,200 A | * | 5/1991 | Kawabata et al. ........... 156/245 |
| 5,048,811 A | * | 9/1991 | Hochbein ...................... 271/5 |
| 5,051,219 A | * | 9/1991 | Miller ........................ 264/40.7 |
| 5,119,954 A | * | 6/1992 | Svyatsky et al. ............. 209/584 |
| 5,222,423 A | * | 6/1993 | Wadzinski .................... 83/88 |
| 5,261,986 A | * | 11/1993 | Kawabata et al. ........... 156/235 |
| 5,358,593 A | * | 10/1994 | Hammuro et al. ........... 156/378 |
| 5,485,989 A | * | 1/1996 | McCay et al. ................. 271/2 |
| 5,567,240 A | * | 10/1996 | Kogame et al. ............. 118/665 |
| 5,582,086 A | * | 12/1996 | Kogame ....................... 83/152 |
| 5,607,535 A | * | 3/1997 | Tsukada et al. ............. 156/252 |
| 6,056,288 A | * | 5/2000 | Tsai et al. .................... 271/213 |
| 6,091,598 A | * | 7/2000 | Kobayashi ................... 29/64.1 |
| 6,095,023 A | * | 8/2000 | Harada et al. ................ 83/152 |

FOREIGN PATENT DOCUMENTS

DE 2205860 * 8/1973 ..................... 83/88

* cited by examiner

Primary Examiner—Allan N. Shoap
Assistant Examiner—Omar Fleves-Sánchez
(74) Attorney, Agent, or Firm—Dickstein, Shapiro, Morin & Oshinsky, LLP.

(57) ABSTRACT

When the step of transferring a ceramic green sheet held on a chuck head having a holding surface with a plurality of vacuum ports distributed thereon onto a depositing table is repeated to obtain a laminated product, undesired deformation or damage is produced on the ceramic green sheet due to negative pressure applied to the chucking port and an obtained monolithic ceramic electronic component becomes defective by aligning of portions having the deformation or the damage in the depositing direction. In order to solve this problem, when transferring of the ceramic green sheet is repeated in the depositing step, the relative positions of the chuck head and the depositing table are shifted so as to bringing the chucking port into the same position during a first transferring step and a subsequent second transferring step.

14 Claims, 3 Drawing Sheets

PRIOR ART

PRIOR ART

MANUFACTURING METHOD OF MONOLITHIC ELECTRONIC COMPONENTS

BACKGROUND OF THE INVENTION

1. Field of the Invention

The present invention relates to a method for manufacturing monolithic electronic components, and in particular relates to an improved method in which plural ceramic green sheets are stacked on top of one another.

2. Description of the Related Art

When monolithic ceramic electronic components such as monolithic ceramic capacitors are manufactured, the following steps are often followed: preparing a mother green sheet with inner conductors printed thereon in a state backed with carrier film; cutting off a ceramic green sheet having a predetermined size from the mother green sheet; peeling off the ceramic green sheet having the predetermined size from the carrier film; and stacking the ceramic green sheets peeled off from the carrier film one on top of the other.

A manufacturing apparatus 1, part of which is shown in detail in FIG. 3, is used to manufacture monolithic ceramic electronic components by using ceramic green sheets as mentioned above.

The manufacturing apparatus 1 comprises a cutting table 4 for positioning a mother ceramic green sheet 3, backed with a carrier film 2 (FIG. 3), via the carrier film 2. On the surface of the mother green sheet 3, inner conductors, such as inner electrodes (not shown), are printed in a distributed pattern.

The carrier film 2 and the mother ceramic green sheet 3 are moved, for example intermittently, along the top surface of the cutting table 4. A plurality of suction ports (not shown) are disposed on the cutting table 4 for applying a negative pressure to chuck the carrier film 2 by vacuum chucking, so as to position the carrier film 2 relative to the cutting table 4.

A cutting blade 5 is located above the cutting table 4 and is movable toward and away from the cutting table 4, so that a ceramic green sheet 6 having a predetermined size is cut off from the mother ceramic green sheet 3 by the cutting blade 5 (see FIG. 3).

A chuck head 7 is disposed in a space surrounded by the cutting blade 5. The chuck head 7 is movable toward and away from the cutting table 4 with the cutting blade 5. The bottom surface of the chuck head 7 is a holding surface 8 for holding the cut off ceramic green sheet 6. The detail of the holding surface 8 is shown in FIG. 4.

A plurality of vacuum ports 9 and 10 are distributed on the holding surface 8. A negative pressure is applied respectively to each of these ports. The cut off ceramic green sheet 6 is held on the holding surface 8 by the vacuum created by the negative pressure respectively applied thereto through the vacuum ports 9 and 10. The vacuum ports 9 and 10 are classified into central vacuum ports 9 located in the central portion of the holding surface 8 and peripheral vacuum ports 10 located at the peripheral portion thereof. As shown in FIG. 4, the peripheral vacuum ports 10 are preferably disposed with a higher density than that of the central vacuum ports 9 to hold the ceramic green sheet 6 more strongly in the peripheral portion.

The manufacturing apparatus 1 operates as follows.

First, the cutting blade 5 descends with the chuck head 7 until the cutting blade 5 cuts a ceramic green sheet 6 having a predetermined size from the mother ceramic green sheet 3. To achieve this result, the edge of the cutting blade 5 protrudes from the holding surface 8 of the chuck head 7 at least during the step of cutting. The degree of protrusion is chosen so as to protrude by a distance which is slightly longer than the thickness of the mother ceramic green sheet 3. The cutting blade 5 does not totally cut the carrier film 2 while it cuts the ceramic green sheet 6 off from the mother ceramic green sheet 3.

When the chuck head 7 descends with the cutting blade 5, the holding surface 8 is brought into contact with the ceramic green sheet 6. At this time, negative pressure is applied to the vacuum ports 9 and 10 to hold the ceramic green sheet 6 onto the holding surface 8. Then the chuck head 7 ascends with the cutting blade 5 to thereby peel the ceramic green sheet 6 off the carrier film 2 and hold the ceramic green sheet 6 on the chuck head 7. The state of this step is shown in the FIG. 3.

Then the chuck head 7 holding the ceramic green sheet 6 is transferred to a position above a depositing table (not shown) located a distance away from the cutting table 4. Next, the chuck head 7 is lowered so as to deposit the ceramic green sheet 6 onto the depositing table. At this time, the ceramic green sheet 6 on the depositing table is pressed slightly with the chuck head 7. By repeating this process (and thereby stacking a plurality of ceramic green sheets 6 one on top of the other on the depositing table), a laminated product formed of a plurality ceramic green sheets 6 is manufactured.

The laminated product is pressed and cut into respective monolithic ceramic electronic components on demand so as to produce raw chips for plural monolithic ceramic electronic components. These raw chips are baked and then external electrodes, etc. are formed thereon, so that desired monolithic ceramic electronic components can be obtained.

With the demand for miniaturizing electronic devices in recent years, miniaturization of monolithic ceramic electronic components used therefor, such as monolithic ceramic capacitors, is also proceeding. As for the monolithic ceramic capacitor in particular, not only miniaturization, but also increased capacity is demanded. In the monolithic ceramic capacitor, an efficient way to increase capacity and miniaturizing is to increase the number of layers while reducing the thickness of a dielectric layer.

Reducing the thickness of the dielectric layer is achieved by reducing the thickness of the mother ceramic green sheet 3 or the ceramic green sheet 6 used in the above-mentioned manufacturing apparatus 1 shown in FIG. 3. In general, the thinner the ceramic green sheet, the more difficult it is to treat. The manufacturing apparatus 1 shown in FIG. 3 has a structure suitable for treating the sheet even when the thickness of the ceramic green sheet 6 is reduced.

However, when the thickness of the ceramic green sheet 6 is reduced to no more than 10 μm, for example, undesired deformation or damage may be generated in the ceramic green sheet 6. More specifically, the ceramic green sheet 6 may be deformed in an area located adjacent the vacuum ports 9 and 10, or it may be damaged in the area where the ceramic green sheet contacts the edge of the vacuum ports 9 and 10. The reasons for these problems are as follows.

FIG. 5 is an exploded sectional view of a single vacuum port, for example one of the central vacuum ports 9, disposed in the chuck head 7.

As described above, holding of the ceramic green sheet 6 with the chuck head 7 is achieved by applying negative pressure to the vacuum ports 9 and 10. Portions 6a of the ceramic green sheet 6 which cover the vacuum ports 9 and 10 are prone to be retracted inside the vacuum ports 9 and 10 as shown in FIG. 5. The degree to which this occurs will be dependent upon the thickness of the ceramic green sheet 6, the sizes of the vacuum ports 9 and 10 and the intensity of the negative pressure. Additionally, since the vacuum ports 9 and 10 are generally formed by drilling or laser working, etc., comparatively sharp edges remain on edges 11 of the vacuum ports 9 and 10 located in the holding surface 8.

For this reason, when the portions 6a of the ceramic green sheet 6 are retracted inside the vacuum ports 9 and 10, undesired deformation is produced in the portions 6a, or in a worse case, the sharp edge 11 cuts into the ceramic green sheet 6 resulting in the damage of the ceramic green sheet 6.

Retraction of the portions 6a of the ceramic green sheet 6 inside the vacuum ports 9 and 10 will not normally be produced while the sheet 6 is backed by carrier film 2. It is likely to occur after the sheet is peeled off the carrier film 2.

The undesired deformation or damage produced in the portion 6a of the ceramic green sheet 6 remains after a plurality of ceramic green sheets 6 are stacked up. FIG. 6 is a partial sectional view of the chuck head 7 and the depositing table 12 showing a plurality of ceramic green sheets 6 stacked one on top of the other.

When inner conductors, such as inner electrodes, are formed on the surface of the mother ceramic green sheet 3 as described above, the ceramic green sheet 6 having a predetermined size is cut off from the mother ceramic green sheet 3 having a predetermined positional relationship relative to the inner conductors. Then in the transferring step, it is necessary to transfer the ceramic green sheet 6 onto the depositing table 12 while maintaining a fixed relationship between the chuck head 7 and the depositing table 12. If there is a gap in the positional relationship between the chuck head 7 and the depositing table 12 during the transferring step, an undesired positional gap between inner conductors arranged on the ceramic green sheets 6 will be generated.

For this reason, in the transferring step, the vacuum ports 9 and 10 of the chuck head 7 are always placed in the same position relative to the deposition table 12. Accordingly, as shown in FIG. 6, the portions 6a of the ceramic green sheets 6, wherein undesired deformation or damage due is produced, are aligned.

The ceramic green sheet 6 on the depositing table 12 is generally pressed slightly with the chuck head 7 as described above. This is done to prevent the occurrence of slippage between deposited (stacked) ceramic green sheets 6 and heat may be applied along with the application of pressure. However, even when such a pressing step is performed, since the vacuum ports 9 or are always positioned in the portions 6a of the ceramic green sheets 6 in which deformation or damage is produced, the application of pressure is not applied to the portions 6a and there is no chance for modifying the undesired deformation or damage. In the worst case, the deformation or the damage may lead to breakage with advancing deposition.

In addition, the laminated product obtained by stacking the plurality of ceramic green sheets 6 is generally pressed again. Modifying of the deformation or the damage described above by this pressing step is not expected.

The laminated product is cut to the size of respective monolithic ceramic electronic components so as to generate raw chips for plural monolithic ceramic electronic components. For that reason, among these chips, all the chips taken from the portions 6a of the ceramic green sheet 6 wherein vacuum ports 9 or 10 are positioned may become defective.

SUMMARY OF THE INVENTION

Accordingly, it is an object of the present invention to provide a method for manufacturing monolithic ceramic electronic components capable of solving the above-mentioned problem.

According to the present invention, a method for manufacturing monolithic ceramic electronic components comprises the act of:

(A) cutting a ceramic green sheet having a predetermined size from a mother ceramic green sheet backed with carrier film using a cutting blade;

(B) removing the ceramic green sheet from the carrier film using a chuck having a plurality of vacuum ports distributed on a holding surface of the chuck, the vacuum ports having a negative pressure applied thereto;

(C) stacking the ceramic green sheet on a depositing table using the chuck; and (D) repeating acts (A) through (C) to deposit successive ceramic green sheets onto the depositing table one on top of the other, the relative positions of the chuck and the depositing table when the chuck deposits first and second successive ceramic green sheets onto the depositing table being shifted with respect to one another so that the vacuum ports of the chuck are not located in the same position relative to the depositing table when the first and second successive ceramic green sheets are laid one on top of the other.

In a preferred embodiment, the act of cutting comprises: positioning the mother ceramic green sheet on a cutting table; and causing relative movement between a cutting blade and the cutting table to cut the ceramic green sheet from the mother ceramic green sheet.

The cutting blade preferably surrounds the chuck.

In the preferred embodiment, for each successive ceramic green sheet deposited on the depositing table, the relative positions of the chuck and the depositing table are shifted so that the vacuum ports of the chuck are, not located in the same position relative to the depositing table when successive ceramic green sheets are laid one on top of the other.

In the preferred embodiment, inner conductors are formed on the mother ceramic sheet in a pattern. The location of each successive ceramic green sheet cut from the mother ceramic green sheet relative to the pattern of the inner conductors formed on the mother ceramic green sheet is shifted by an amount corresponding to the shift of the relative positions of the chuck and the depositing table during successive acts of depositing successive ceramic green sheets one on top of the other.

The invention preferably also includes the act of pressing the successive ceramic green sheets together with the previously deposited ceramic green sheets, the act of pressing being repeated after each successive ceramic green sheet is deposited on top of the previously deposited ceramic green sheets.

BRIEF DESCRIPTION OF THE DRAWINGS

Other features and advantages of the present invention will become apparent from the following description of the invention which refers to the accompanying drawings.

DESCRIPTION OF THE PREFERRED EMBODIMENT

Figure 1:
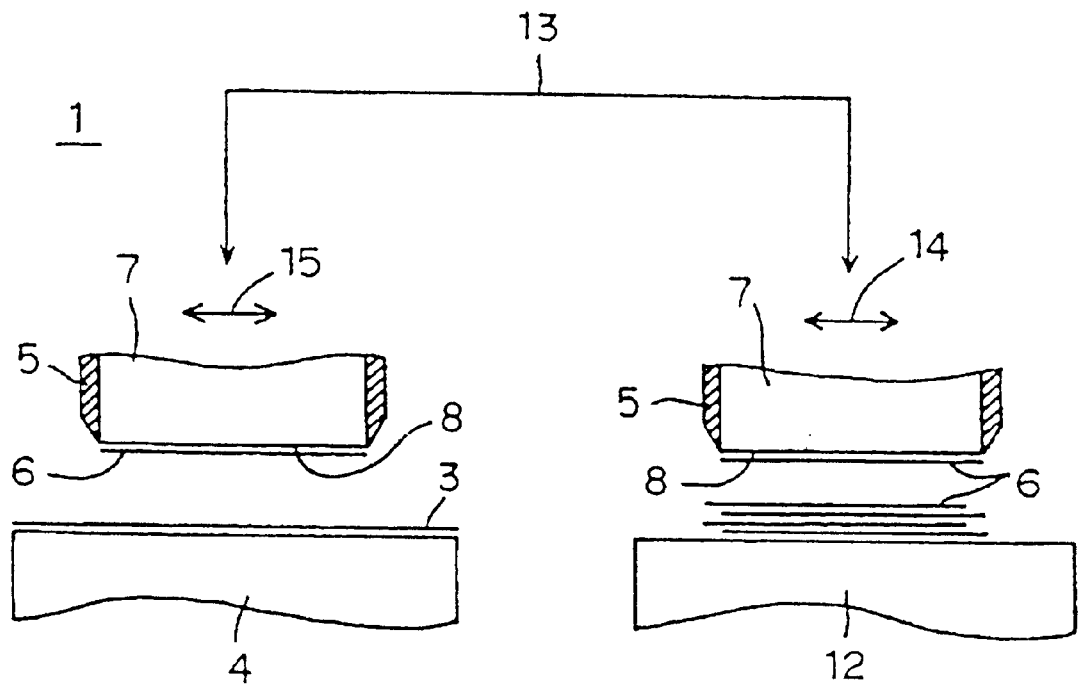
FIG. 1 is a schematic front view of a manufacturing apparatus 1 of monolithic ceramic electronic components diagrammatically showing a method for manufacturing monolithic ceramic electronic components according to an embodiment of the present invention.
Figure 2:
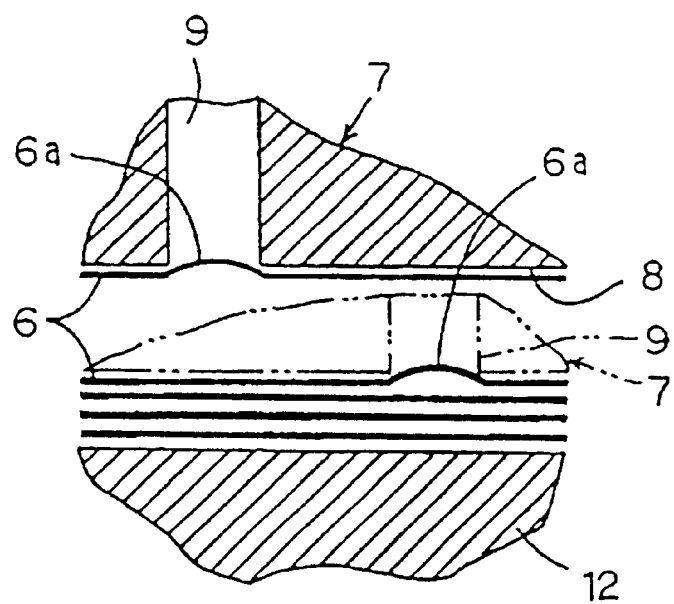
FIG. 2 is a partly exploded sectional view of a chuck head 7 and a depositing table 12 shown in FIG. 1 for illustrating a shifting step of the present invention.

A manufacturing method of forming monolithic ceramic electronic components according to an embodiment of the present invention, which will be described, is basically performed using the manufacturing apparatus 1 described above with reference to FIGS. 3 to 6. FIGS. 1 and 2 illustrate a characteristic configuration according to the embodiment and show the manufacturing apparatus 1 described with reference to FIGS. 3 to 6. Therefore, in FIGS. 1 and 2, like reference characters designate like elements common to those shown in FIGS. 3 to 6, and a repeated description thereof is abbreviated.

Referring to FIG. 1, the manufacturing apparatus 1 comprises the cutting table 4, a cutting blade 5, a chuck head 7, and a depositing table 12, as described above. With such a manufacturing apparatus 1, monolithic ceramic electronic components such as monolithic ceramic capacitors are manufactured as follows.

The mother ceramic green sheet 3, backed with the carrier film 2 (not shown in FIG. 1), is intermittently transferred along the top surface of the cutting table 4, for example, and positioned on the cutting table 4 after transferring. On the surface of the mother green sheet 3, inner conductors, such as inner electrodes (not shown), are printed in a plurality of distributed positions.

Then, the cutting blade 5 descends with the chuck head 7 and cuts off a ceramic green sheet 6 having a predetermined size from the mother ceramic green sheet 3 on the cutting table 4.

Figure 3:
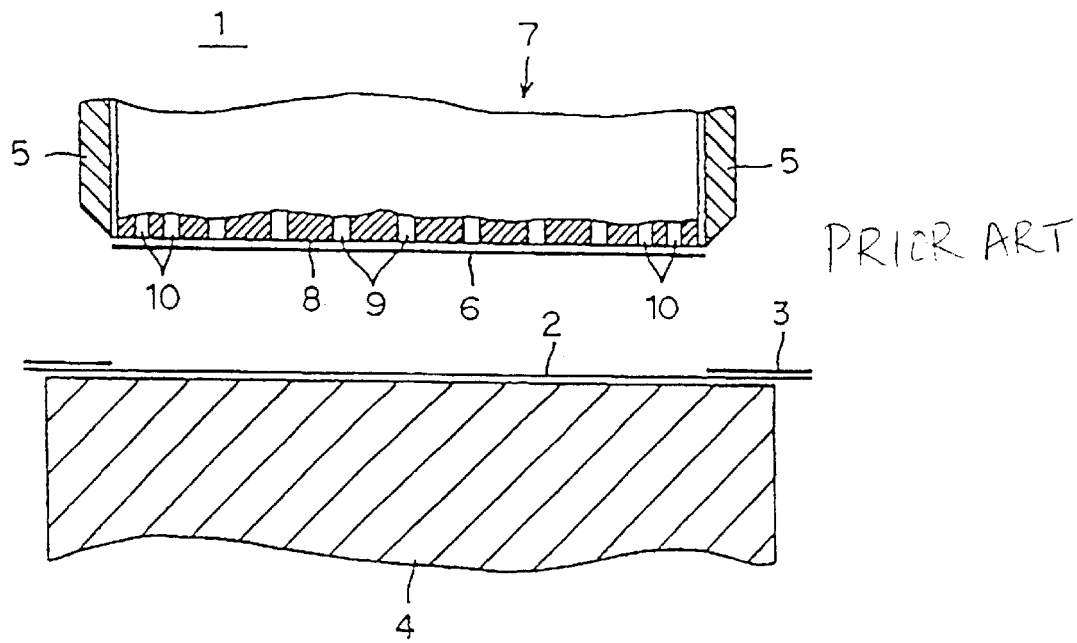
FIG. 3 is an enlarged sectioned front view of the chuck head 7 and the cutting table 4 of the manufacturing apparatus 1 shown in FIG. 1.
Figure 4:
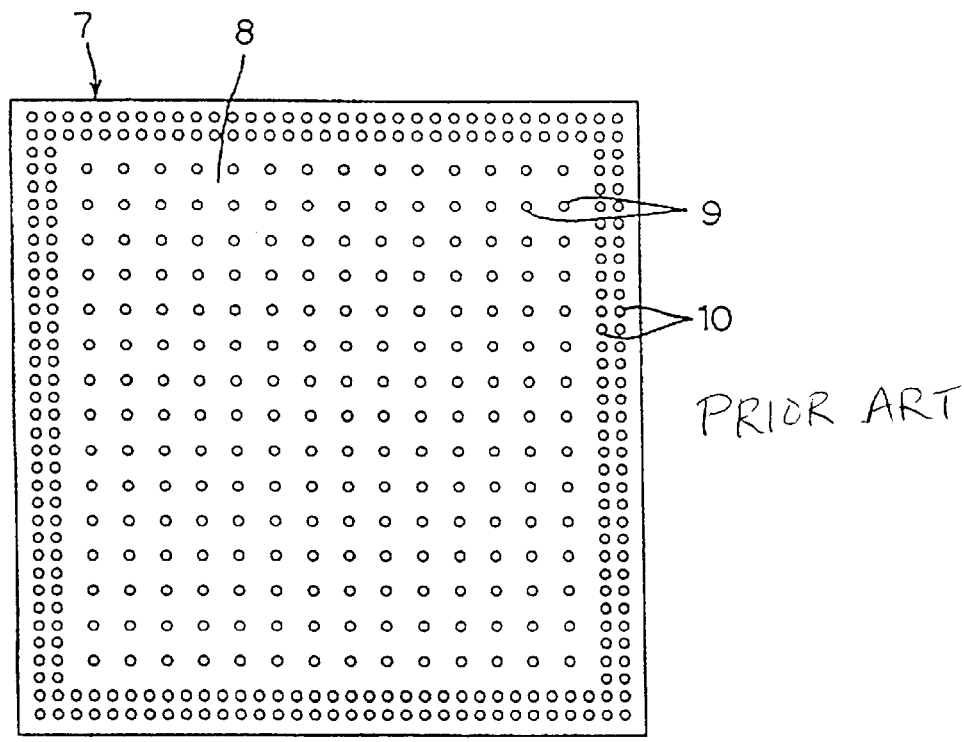
FIG. 4 shows a holding surface 8 of the chuck head 7 shown in FIG. 3.
Figure 5:
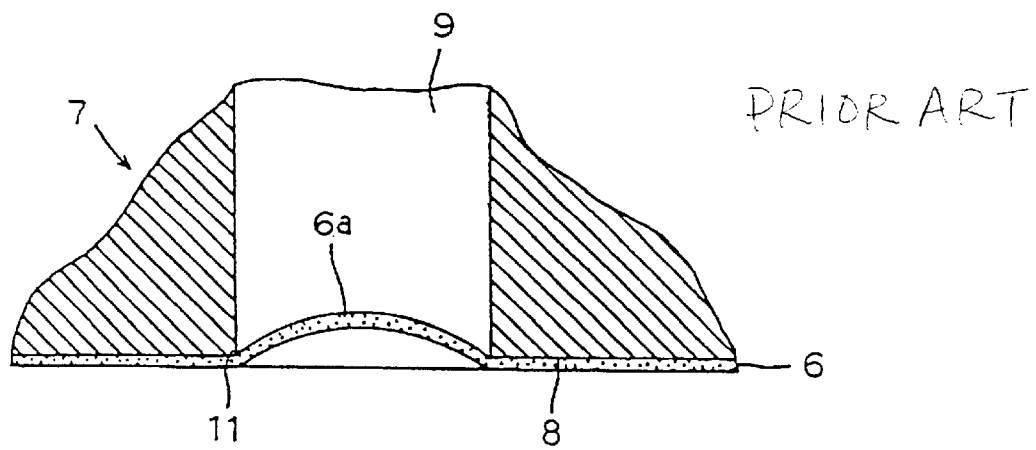
FIG. 5 is an exploded sectional view of a portion 6a wherein deformation or damage due to a vacuum port 9 disposed in the chuck head 7 are produced in a ceramic green sheet 6 for illustrating the problem to be solved by the present invention.
Figure 6:
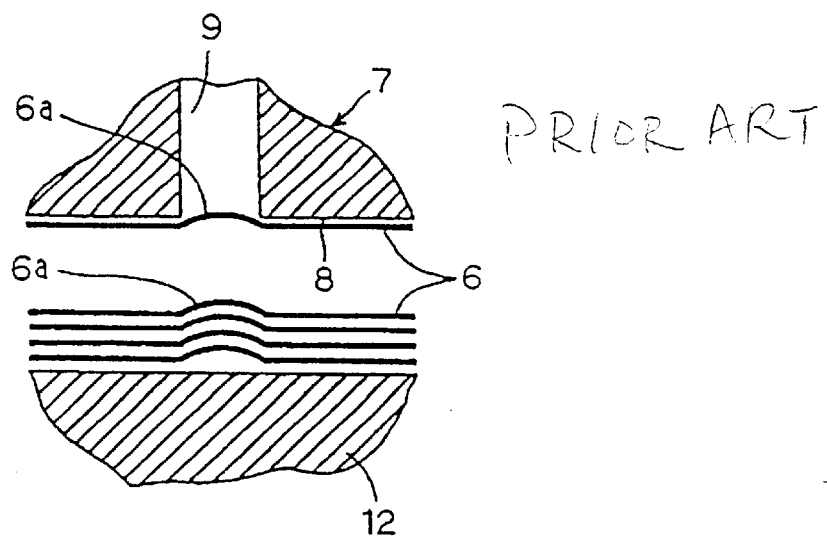
FIG. 6 is a partial sectional view of the chuck head 7 and the depositing table 12 in a state performing depositing step of the ceramic green sheets 6 shown in FIG. 5.

When the chuck head 7 descends with the cutting blade 5, the holding surface 8 is brought into contact with the ceramic green sheet 6, so that the ceramic green sheet 6 is held on the holding surface 8 by the negative pressure applied to the vacuum ports 9 and 10 (see FIG. 3).

Then the chuck head 7 ascends along with the cutting blade 5 to thereby peel the ceramic green sheet 6 off the carrier film 2 and holds the ceramic green sheet 6 with the chuck head 7. The chuck head 7 holding the ceramic green sheet 6 is then transferred to a location above the depositing table 12 following a route 13. Next, the chuck head 7 is lowered so as to lay the ceramic green sheet 6 onto the depositing table 12. At this time, the ceramic green sheet 6 on the depositing table 12 is pressed with the chuck head 7.

By repeating the step of transferring the ceramic green sheet 6 held on the chuck head 7 onto the depositing table 12 along the route 13, a laminated product formed of plurality of ceramic green sheets 6 is manufactured.

This laminated product is furthermore pressed and then cut into sizes of respective monolithic ceramic electronic components on demand so as to generate raw chips. These raw chips are baked and then external electrodes, etc. are formed thereon, so that desired monolithic ceramic electronic components can be obtained.

The above description of the manufacturing method of monolithic ceramic electronic components is substantially the same as that of the conventional one. A feature of the embodiment is that in the step of depositing the plurality of ceramic green sheets 6 to obtain a laminated product during repeating the step of transferring the ceramic green sheet 6 onto the depositing table 12, the relative position of the chuck head 7 and that of the depositing table 12 is shifted so that respective positions of the vacuum ports 9 and 10 of the chuck head 7 are not brought into the same positions between a first transferring step and a subsequent second transferring step.

Referring to FIG. 2, the process will be described more specifically. The chuck head 7 is placed in a position indicated by a phantom line in the first transferring step and is placed in a second position, indicated by a solid line, in the subsequent second transferring step. In this manner, the vacuum port 9 of the chuck head 7 is positioned differently between the first transferring step and the second transferring step. Consequently, the portion 6a where an undesired deformation or damage was produced due to the vacuum port 9 in the first transferring step, is opposed by a portion of the holding surface 8 of the chuck head 7 wherein the vacuum ports 9 or 10 are not disposed during the second transferring step. When a ceramic green sheet 6 is laid up on the previous ceramic green sheet 6 in the second transferring step, undesired deformation or damage in the previous ceramic green sheet 6 is advantageously modified. At this time, when the ceramic green sheet 6 is pressed with the chuck head 7, the above-mentioned modification is further promoted. When it is heated via the chuck head 7, for example, the modification is performed more smoothly.

In FIG. 1, as described above, a shift of relative positions of the chuck head 7 and the depositing table 12 is indicated by the two-headed arrow 14. Such the shift may be produced by either the displacement of the chuck head 7 or the displacement of the depositing table 12, or may be produced by shifting both.

In this embodiment, since inner conductors have been already formed in a predetermined, repeating pattern on the mother ceramic green sheet 3, the inner conductors are also formed on the ceramic green sheet 6 cut therefrom and held with the chuck head 7. Therefore, when positions of the chuck head 7 and the depositing table 12 are simply shifted in the depositing step, the shift of relative positions of the chuck head 7 and the depositing table 12 is reflected as a shift of positions of inner conductors in the laminated product.

In order to avoid such a problem, the cutting step is performed so that the ceramic green sheet 6 having a predetermined size is cut off from the mother ceramic green sheet 3 by shifting the position of the cutting blade 5 relative to that of the mother ceramic green sheet 3 by an amount corresponding to the shift of relative positions of the chuck head 7 and the depositing table 12 produced in the depositing step as described above. This shift is indicated by the two-headed arrow The above-mentioned shift of the relative positions of the cutting blade 5 and the mother ceramic green sheet 3 may be produced by the displacement of the cutting blade 5 or the cutting table 4, or by changing the positioning state of the mother ceramic green sheet 3 to be positioned on the cutting table 4, or may be produced by a combination of them.

The present invention has been described in accordance with the specific embodiment; however various modifications may be made within the scope of the present invention.

For example, the shift 14 of relative positions of the, chuck head 7 and the depositing table 12 and the shift 15 of relative positions of the cutting blade 5 and the! mother ceramic green sheet 3 may be produced in any direction as long as it is along the plane of the main surface of the ceramic green sheet 6.

In the embodiment described above, inner conductors such as inner electrodes are printed in the step of producing the mother ceramic green sheet 3. However such inner conductors may be printed at every step of transferring each ceramic green sheet 6 onto the depositing table 12 or in the depositing step of the ceramic green sheets 6 on the depositing table 12. In this case, since no inner conductor is printed on the ceramic green sheets 6 in the shifting step of relative positions of the chuck head 7 and the depositing table 12, it is not necessary to produce a shift in the step of cutting the ceramic green sheet 6 from the mother ceramic green sheet 3 by an amount of shifting corresponding to the above-mentioned shift in the shifting step.

The above-mentioned shifting step may be performed at every transferring step or at every plurality of transferring steps.

In the shifting step, the vacuum ports that are brought into different positions from the first transferring step to the subsequent second transferring step by the shifting of relative positions of the chuck head and the depositing table may be only the central vacuum ports 9. The reason is that even when deformation or damage is produced due to the peripheral vacuum ports 10, it is likely that the peripheral portion of the laminated product will be removed when raw chips for monolithic ceramic electronic components are obtained.

As described above, according to the present invention, when the step of transferring the ceramic green sheet onto a depositing table in a state held with the chuck head having plural vacuum ports distributed on the holding surface of the chuck head, negative pressure being applied to respective vacuum ports, is repeated to obtain a laminated product formed of plural ceramic green sheets, the relative positions of the chuck head and the depositing table are shifted so as to avoid bringing the vacuum port of the chuck head into the same position between a first transferring step and a subsequent second transferring step. Therefore, portions of the ceramic green sheets in which undesired deformation or damage is produced due to the vacuum port will not be aligned with each other in the depositing direction and the deformation or damage can be modified by when the next ceramic green sheet is stacked thereon.

Accordingly, defective monolithic ceramic electronic components due to such the undesired deformation or damage remaining therein can be reduced.

The deformation or damage in the ceramic green sheet described above is especially prone to be produced in a thin ceramic green sheet. Therefore, the present invention can be especially advantageously applied to a case in which a thin ceramic green sheet is used. Consequently, the thickness of the monolithic ceramic electronic component can be reduced while increasing of the number of layers thereof, resulting in manufacturing of miniaturized monolithic ceramic electronic components having excellent performance with a high yield. In particular, when applied to manufacturing of monolithic ceramic capacitors, a large capacity can be advantageously achieved in spite of the compact size.

In the present invention, when the shifting step is performed in the intervals of the transferring steps, since the undesired deformation or damage produced in the ceramic green sheet is effectively dispersed within the laminated product, harmful influence thereon due to such the undesired deformation or damage can be more effectively reduced.

According to the present invention, when inner conductors have been already formed in a plurality of distributed positions on the mother ceramic green sheet, when the ceramic green sheet is cut from the mother ceramic green sheet the portion cut is shifted is cut by an amount corresponding to that of the above-mentioned shifting step. This avoids undesired shifting of relative positions of inner conductors in the laminated product.

According to the present invention, when the ceramic green sheet is transferred to the depositing table with the chuck head, if the ceramic green sheet on the depositing table is pressed with the chuck head, undesired deformation or damage can be more effectively modified by pressing of the chuck head against the stacked green sheets. Therefore, harmful influence thereon due to deformation or damage produced in the ceramic green sheet before depositing can be mostly eliminated. In this case, as described above, when the shifting step is performed in the intervals of the transferring steps, undesired deformation or damage produced in the ceramic green sheet can be more easily modified with the chuck head.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What at is claimed is:

1. A method for manufacturing monolithic ceramic electronic components, the method comprising the acts of:
   (A) cutting a ceramic green sheet having a predetermined size from a mother ceramic green sheet backed with carrier film using a cutting blade;
   (B) removing the ceramic green sheet from the carrier film using a chuck having a plurality of vacuum ports distributed on a holding surface of the chuck, the vacuum ports having a negative pressure applied thereto;
   (C) depositing the ceramic green sheet on a depositing table using the chuck; and
   (D) repeating acts (A) through (C) to deposit successive ceramic green sheets onto the depositing table one on top of the other, the relative positions of the chuck and the depositing table when the chuck deposits first and second successive ceramic green sheets onto the depositing table being shifted with respect to one another so that the vacuum ports of the chuck are not located in the same position relative to the depositing table when the first and second successive ceramic green sheets are laid one on top of the other, whereby the vacuum port depositing position of the first and second successive ceramic green sheets in the formation resulting from the repeating are offset from one another.

2. The method of claim 1, wherein the act of cutting comprises:
   positioning the mother ceramic green sheet on a cutting table; and causing relative movement between a cutting blade and the cutting table to cut the ceramic green sheet from the mother ceramic green sheet.

3. The method of claim 2, wherein the cutting blade surrounds the chuck.

4. The method of claim 1, wherein for each successive ceramic green sheet deposited on the depositing table, the relative positions of the chuck and the depositing table are shifted so that the vacuum ports of the chuck are not located in the same position relative to the depositing table when successive ceramic green sheets are laid one on top of the other.

5. The method of claim 4, wherein inner conductors are formed on the mother ceramic green sheet in a pattern.

6. The method of claim 5, wherein the location of each successive ceramic green sheet cut from the mother ceramic green sheet relative to the pattern of inner conductors formed on the mother ceramic green sheet is shifted by an amount corresponding to the shift of the relative positions of the chuck and the depositing table during the successive acts of depositing successive ceramic green sheets one on top of the other.

7. The method of claim 4, further including the act of pressing each successive ceramic green sheets together with the previously deposited green sheets, the act of pressing being repeated after each successive ceramic green sheet is deposited on top of the previously deposited ceramic green sheets.

8. The method of claim 7, wherein the chuck is used to press the successive ceramic green sheets together.

9. The method of claim 1, wherein inner conductors are formed on the mother ceramic green sheet in a pattern.

10. The method of claim 9, wherein the location of the first and second successive ceramic green sheets cut from the mother ceramic green sheet relative to the pattern of inner conductors formed on the mother ceramic green sheet is shifted by an amount corresponding to the shift of the relative positions of the chuck and the depositing table when the first and second ceramic green sheets are deposited one on top of the other.

11. The method of claim 1, further including the act of pressing the first and second ceramic green sheets together after they have been laid one on top of the other.

12. The method of claim 11, wherein the act of pressing the first and second ceramic green sheets together occurs before a third successive ceramic green sheet is placed upon the first and second ceramic green sheets.

13. The method of claim 12, wherein the chuck is used to press the first and second ceramic green sheets together.

14. The method of claim 11, wherein the chuck is used to press the first and second ceramic green sheets together.

* * * * *